United States Patent
Baba et al.

(10) Patent No.: US 6,856,658 B1
(45) Date of Patent: Feb. 15, 2005

(54) DIGITAL PLL CIRCUIT OPERABLE IN SHORT BURST INTERVAL

(75) Inventors: Mitsuo Baba, Tokyo (JP); Masaki Sato, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/558,422

(22) Filed: Apr. 26, 2000

(30) Foreign Application Priority Data

May 7, 1999 (JP) .......................................... 11-127421

(51) Int. Cl.[7] .............................................. H04L 7/00
(52) U.S. Cl. ..................... 375/355; 375/375; 375/376; 370/516; 327/146; 327/152; 327/159; 327/163
(58) Field of Search ................................ 375/354, 355, 375/360, 371, 373, 375, 376; 327/141, 144, 146, 150, 152, 155, 156, 159, 163; 370/503, 516

(56) References Cited

U.S. PATENT DOCUMENTS

| | | | |
|---|---|---|---|
| 5,687,203 A | | 11/1997 | Baba |
| 5,870,441 A | * | 2/1999 | Cotton et al. ................ 375/354 |
| 5,920,600 A | * | 7/1999 | Yamaoka et al. ............. 375/376 |
| 6,236,696 B1 | * | 5/2001 | Aoki et al. ................... 375/376 |
| 6,329,850 B1 | * | 12/2001 | Mair et al. ................... 327/107 |
| 6,373,911 B1 | * | 4/2002 | Tajima et al. ................ 375/375 |

FOREIGN PATENT DOCUMENTS

| | | |
|---|---|---|
| JP | 4-156022 | 5/1992 |
| JP | 9-116425 | 5/1997 |
| JP | 9-139733 | 5/1997 |
| JP | 2773669 | 4/1998 |
| JP | 10-327068 | 12/1998 |

* cited by examiner

Primary Examiner—Dac V. Ha
(74) Attorney, Agent, or Firm—McGinn & Gibb, PLLC

(57) ABSTRACT

A digital PLL (phase locked loop) circuit includes a sampling circuit, a plurality of internal circuits and an output switching circuit. The sampling circuit samples a burst data signal in response to a multi-phase clock signal to produce N (N is a positive integer larger than one) sampled data signals. The multi-phase clock signal includes N clock signals, each of which has substantially the same frequency as the data signal and which have phases different by a predetermined component from one after another. Each of the plurality of internal circuits is selected in response to a first selection signal, and outputs a set of a selected one of the N clock signals and an identified data signal from the N sampled data signals, which corresponds to the selected clock signal, in response to the selected clock signal, when the internal circuit is selected. The output switching circuit selects the set corresponding to the selected internal circuit from among the sets from the plurality of internal circuits based on a second selection signal.

18 Claims, 8 Drawing Sheets

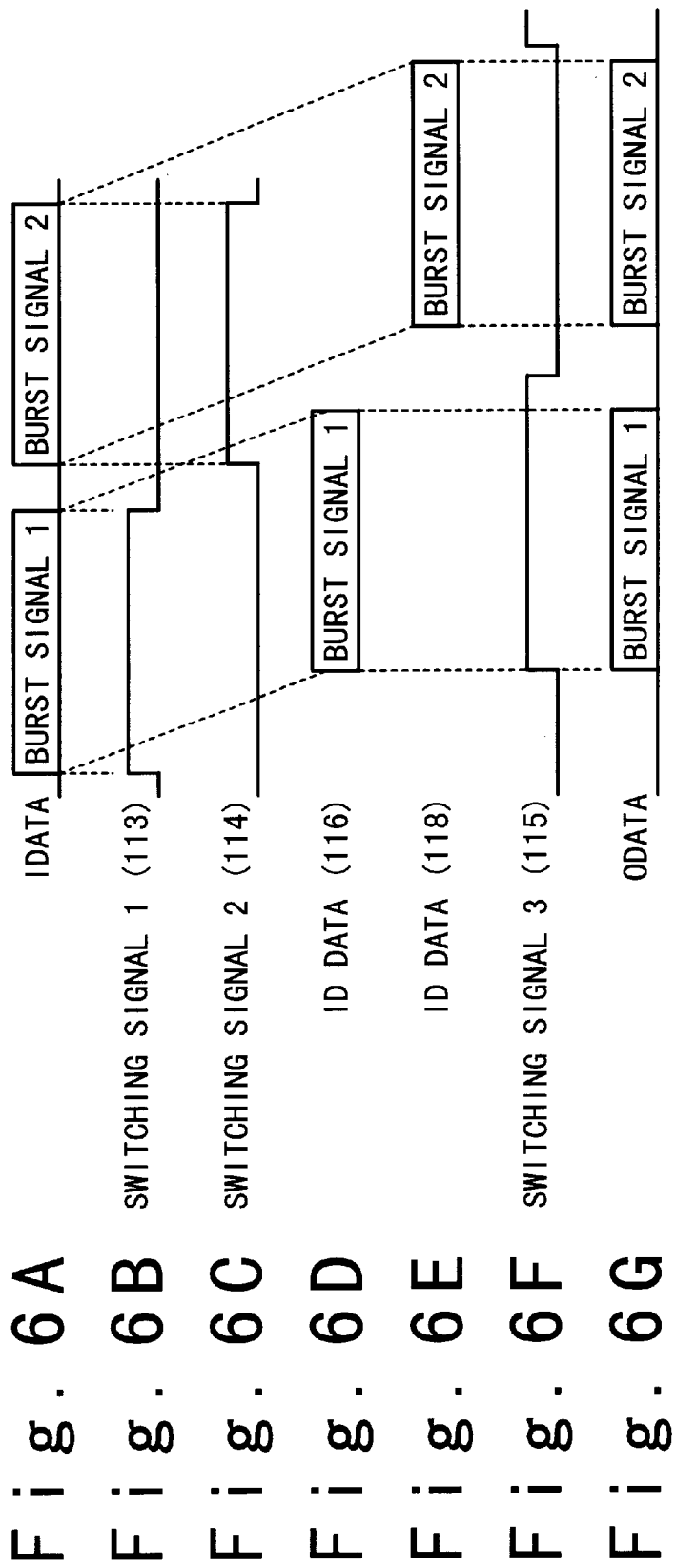

DIGITAL PLL CIRCUIT OPERABLE IN SHORT BURST INTERVAL

BACKGROUND OF THE INVENTION

1. Field of the Invention

The present invention relates to a digital PLL (phase locked loop) circuit.

2. Description of the Related Art

A conventional digital PLL circuit is supplied with a burst data signal. In this case, a phase locking time becomes long, when the data signal has a large phase change due to frequency deviation, duty change and jitter. As a result, an identification error is caused in case of the re-timing of the receive data signal based on a clock signal extracted from the data signal.

Such a problem is solved in a digital PLL circuit disclosed in U.S. patent application Ser. No. 09/083,704 corresponding to Japanese Laid Open Patent application (JP-A-Heisei 10-327068). The disclosure is incorporated herein by reference.

The digital PLL circuit in U.S. patent application Ser. No. 09/083,704 is shown in FIG. 1. A burst data signal has a different jitter quantity and a different duty change quantity for every burst data signal, as shown in FIG. 1. Therefore, a duty determining circuit 908 takes such a burst data signal at periodic change portions to measure the duty. An identified data selecting circuit 909 determines a data selection phase based on a duty data outputted from the duty determining circuit 908 and an average rising edge phase data outputted from an average rising edge phase calculating circuit 907. In this way, a clock signal can be extracted in several bits from the head of the data signal. Also, the data signal can be identified without any error due to jitter. Thus, the data signal subjected to the identification re-timing with no error is outputted.

However, in this reference shown in FIG. 1, the burst data signal is processed in order by a single circuit. Therefore, the signal processing waiting state is caused, when a processing time of a phase synchronizing operation and data identifying operation to the burst data signal becomes long.

In conjunction with the above description, a digital PLL circuit is disclosed in U.S. Pat. No. 5,687,203 which corresponding to Japanese Patent No. 2,773,669 corresponding to Japanese Laid Open Patent Application (JP-A-Heisei 8-237117). In this reference, the digital PLL circuit is composed of a clock extracting circuit for extracting one from N phase clock signals in response to an extraction signal. The N phase (N is equal to or more than 2 integers) clock signals have the same frequency as the burst data signal and phases shifted by 360 degrees/N in order. A sampling circuit samples the burst data signal with the N phase clock signals to produce N sampled data signals. An rearranging circuit sets the extracted clock signal as a first phase clock signal, and sets the remaining clock signals as second to N-th clock signals in order. Then, the rearranging circuit rearranges the sampling data signals in correspondence to the first to N-th phase clock signals as first to n-th sampling data signals. A latch circuit latches said first to N-th phase sampling data signals in response to the first phase clock signal. An edge detecting circuit detects the position of a falling edge based on the levels of adjacent two of the first to N-th phase sampling data signals to generate a data indicative of the detected falling edge position for every period of the said clock signal. Also, the edge detecting circuit detects the number of falling edges and the number of rising edges for every period of the said clock signal. An average calculating circuit calculates an average of the falling edge position data from the past to the current for every period, to output as the extraction signal. A data selecting circuit selects one of the rearranged first to N-th phase sampling data signals based on the detected number of falling edges and the detected number of rising edges. Finally, a re-timing circuit carries out a re-timing operation to the selected sampling data signal in response to the first phase clock signal.

Also, a clock signal supply circuit is disclosed in Japanese Laid Open Patent Application (JP-A-Heisei 9-116425). In this reference, the ON/OFF state of the first and second switch sections are switched oppositely such that an output signal of one of the phase-locked oscillation circuits is given to the other phase-locked oscillation circuit as an input signal, when a fault detection circuit of a currently used phase-locked oscillation circuit detects any trouble, and when the fault detection circuits of both of phase-locked oscillation circuits detects any trouble. Alternatively, when it is detected from the output signals of fault detection circuits of the first and second reference oscillators that one of the reference oscillators had a malfunction, or when the phase-locked oscillation circuit had a malfunction which inputs one of the output signals of these reference oscillators in common through a switch section, a normal reference oscillator or the reference oscillator which is not selected at present is selected.

Also, a clock signal selecting circuit is disclosed in Japanese Laid Open-Patent Application (JP-A-Heisei 9-139733). In this reference, the clock signal selecting circuit selects one of from M series of clock pulse sequences having different phases which synchronizes with a received burst signal in phase, based on the detection timing of the change point of the rising edge or falling edge of the received burst signal. For this purpose, M signal holding sections (11 14) hold signals showing the detection timings of the change points of the rising edge or falling edge of the received burst signal. M AND gates (15 to 18) inputs positively transferred signals from the respective signal holding sections (11 to 14) at an input terminal and inputs inverted output signals from the signal holding section (11 to 14) of the next phase (here, the next phase to the M phase is a single phase). Output signals from the AND gates (15 to 18) are outputted to the next stage as phase selection signals.

Also, a digital PLL circuit is disclosed in Japanese Laid Open Patent Application (JP-A-Heisei 10-327068). In this reference, a duty determining circuit 8 takes in a continuously changing data signal at a periodic change point of the data signal and determines a duty. An identified data selecting circuit 9 determines a data selection phase based on average rising edge phase data (108) and a duty data (109).

Also, a frame phase synchronizing circuit is disclosed in Japanese Laid Open Patent Application (JP-A-Heisei 4-156022). In this reference, a receiving circuit reproduces a data signal and a clock signal from a received signal and detects a fault such as a synchronization-out of the received data signal. A write address control circuit generates a write address signal of a dual port memory based on a reference clock signal. A read address control circuit generates a read address signal of the dual port memory based on the reference clock signal. A data writing and reading operation is optional in the dual port memory. A frame synchronizing circuit identifies a received frame number from the received data signal. The frame phase synchronizing circuit includes two circuits, each of which has the receiving circuit, the write address control circuit, the read address control circuit, the dual port memory and the frame synchronizing circuit. A phase comparing circuit compares the frame numbers from the two circuits to generate the reference clock signal. A data selecting circuit selects one of the data outputted from the dual port memories based on a data selection signal. A warning control circuit receives synchronization-out signals from the receiving circuits to output the data selection signal. When the synchronization-out is detected by the receiving circuit, the warning control circuit outputs the data selection signal to select a normal one of the data signals. The phase difference between the write address signal and the read address signal is set to be three or more frames of the received data signal.

SUMMARY OF THE INVENTION

Therefore, an object of the present invention is to provide a PLL circuit in which the signal processing wait does not occur.

Another object of the present invention is to provide a PLL circuit in which two phases of internal circuits of the PLL circuit are alternately used to a request to narrow a burst interval of a burst data signal.

Still another object of the present invention is to provide a PLL circuit which can secure good reception characteristic when the burst interval of a data signal is very narrow.

In order to achieve an aspect of the present invention, a digital PLL (phase locked loop) circuit includes a sampling circuit, a plurality of internal circuits and an output switching circuit. The sampling circuit samples a burst data signal in response to a multi-phase clock signal to produce N (N is a positive integer larger than one) sampled data signals. The multi-phase clock signal includes N clock signals, each of which has substantially the same frequency as the data signal and which have phases different by a predetermined component from one after another. Each of the plurality of internal circuits is selected in response to a first selection signal, and outputs a set of a selected one of the N clock signals and an identified data signal from the N sampled data signals, which corresponds to the selected clock signal, in response to the selected clock signal, when the internal circuit is selected. The output switching circuit selects the set corresponding to the selected internal circuit from among the sets from the plurality of internal circuits based on a second selection signal.

Here, the digital PLL circuit may include two internal circuits. The first selection signals are supplied to the two internal circuits such that the two internal circuits operates alternately for every the data signal. Also, the output switching circuit outputs the sets of the selected clock signal and the identified data signal from the two internal circuits alternately for every the data signal.

Also, each of the plurality of internal circuits may include a clock signal selecting circuit, a switching circuit, a phase comparing circuit, an average falling edge phase determining section, an average rising edge phase determining section, a duty detecting circuit, an identifying circuit and a re-timing circuit. The clock signal selecting circuit selects the selected clock signal from the N clock signals based on an average falling edge phase data, and outputs the selected clock signal to the output switching circuit. The switching circuit passes the N sampled data signals in response to the first selection signal. The phase comparing circuit compares the selected clock signal and each of the N sampled data signals in phase to output post-comparison data signals. The average falling edge phase determining circuit determines an average falling edge phase from the N sampled data signals to output the average falling edge phase data to the clock signal selecting circuit. The average rising edge phase determining circuit determines an average rising edge phase from the N sampled data signals to output an average rising edge phase data. The duty detecting circuit detects a duty of each of the N sampled data signals to produce duty data. The identifying circuit determines a data selection phase based on the average rising edge phase data and the duty data for the N sampled data signals. Also, the identifying circuit selects one from the post-comparison data signals which has a phase near to the data selection phase, and outputs the selected post-comparison data signal as a selection data signal. The re-timing circuit carries out a re-timing operation to the selection data signal based on the selected clock signal to output to the output switching circuit.

Also, each of the plurality of internal circuits may include a clock signal selecting circuit, a switching circuit, a phase comparing circuit, an average falling edge phase determining section, an average rising edge phase determining section, a duty detecting circuit, an identifying circuit and a re-timing circuit. The clock signal selecting circuit selects the selected clock signal from the N clock signals based on a first average falling edge phase data, and outputs the selected clock signal to the output switching circuit. The switching circuit passes the N sampled data signals in response to the first selection signal. The phase comparing circuit compares the selected clock signal and each of the N sampled data signals in phase to output post-comparison data signals. The average falling edge phase determining section determines an average falling edge phase from the N sampled data signals to generate the first average falling edge phase data and a second average falling edge phase data, and outputs the first average falling edge phase data to the clock signal selecting circuit. The average rising edge phase determining section determines an average rising edge phase from the N sampled data signals and the second average falling edge phase data to output an average rising edge phase data. The duty detecting circuit detects a duty of each of the N sampled data signals to produce duty data. The identifying circuit determining a data selection phase based on the average rising edge phase data and the duty data for the N sampled data signals. Also, the identifying circuit selects one from the post-comparison data signals which has a phase near to the data selection phase, and outputs the selected post-comparison data signal as a selection data signal. The re-timing circuit carries out a re-timing operation to the selection data signal based on the selected clock signal to output to the output switching circuit.

Also, each of the plurality of internal circuits may include a clock signal selecting circuit, a switching circuit a phase comparing circuit, an average falling edge phase determining section, an average rising edge phase determining section, a duty detecting circuit, an identifying circuit and a re-timing circuit. The clock signal selecting circuit selects the selected clock signal from the N clock signals based on a first average falling edge phase data, and outputs the selected clock signal to the output switching circuit. The switching circuit passes the N sampled data signals in response to the first selection signal. The phase comparing circuit compares the selected clock signal and each of the N sampled data signals in phase to output post-comparison data signals. The average rising edge phase determining section determines an average rising edge phase from the N sampled data signals to generate the first average rising edge phase data and a second average rising edge phase data, and outputs the first average rising edge phase data to the clock signal selecting circuit. The average falling edge phase determining section determines an average falling edge phase from the N sampled data signals and the second average rising edge phase data to output an average falling edge phase data. The duty detecting circuit detects a duty of each of the N sampled data signals to produce duty data. The identifying circuit determines a data selection phase based on the average falling edge phase data and the duty data for the N sampled data signals. Also, the identifying circuit selects one from the post-comparison data signals which has a phase near to the data selection phase, and outputs the selected post-comparison data signal as a selection data signal. The re-timing circuit carries out a re-timing operation to the selection data signal based on the selected clock signal to output to the output switching circuit.

Also, each of the plurality of internal circuits may include a clock signal selecting circuit, a switching circuit, a phase comparing circuit, an average falling edge phase determining section, an average rising edge phase determining section, an identifying circuit and a re-timing circuit. The clock signal selecting circuit selects the selected clock signal from the N clock signals based on a first average falling edge phase data, and outputs the selected clock signal to the output switching circuit. The switching circuit passes the N sampled data signals in response to the first selection signal. The phase comparing circuit compares the selected clock signal and each of the N sampled data signals in phase to output post-comparison data signals. The average falling edge phase determining circuit determines an average falling edge phase from the N sampled data signals to generate the first average falling edge phase data and a second average falling edge phase data, and outputs the first average falling edge phase data to the clock signal selecting circuit. The average rising edge phase determining circuit determines an average rising edge phase from the N sampled data signals and the second average falling edge phase data to output an average rising edge phase data. The identifying circuit determines a data selection phase based on the average rising edge phase data, selecting one from the post-comparison data signals which has a phase near to the data selection phase. Also, the identifying circuit outputs the selected post-comparison data signal as a selection data signal. The re-timing circuit carries out a re-timing operation to the selection data signal based on the selected clock signal to output to the output switching circuit.

In order to achieve another aspect of the present invention, a method of reducing a time interval between burst data signals in a digital PLL (phase locked loop) circuit, is attained by (a) sampling a burst data signal in response to a multi-phase clock signal to produce N (N is a positive integer larger than one) sampled data signals, the multi-phase clock signal including N clock signals, each of which has substantially the same frequency as the data signal and which have phases different by a predetermined component from one after another; by (b) selecting one of a plurality of internal circuits other than a currently used internal circuit in response to a first selection signal; by (c) producing a set of a selected one of the N clock signals and an identified data signal from the N sampled data signals in response to the selected clock signal in the selected internal circuit; and by (d) selecting one of the sets from the plurality of internal circuits based on a second selection signal.

Here, the (b) selecting step may include supplying the first selection signals to the two internal circuits such that the two internal circuits operates alternately for every the data signal. Also, the (d) selecting may include supplying the second selection signal such that the sets of the selected clock signal and the identified data signal are alternately selected from the two internal circuits alternately for every the data signal.

Also, the (c) producing may be attained by selecting the selected clock signal from the N clock signals based on an average falling edge phase data; by passing the N sampled data signals in response to the first selection signal; by comparing the selected clock signal and each of the N sampled data signals in phase to produce post-comparison data signals; by determining an average falling edge phase from the N sampled data signals; by determining an average rising edge phase from the N sampled data signals; by detecting a duty of each of the N sampled data signals to produce duty data; by determining a data selection phase based on the average rising edge phase data and the duty data for the N sampled data signals; by selecting one from the post-comparison data signals which has a phase near to the data selection phase, to output the selected post-comparison data signal as a selection data signal; and by carrying out a re-timing operation to the selection data signal based on the selected clock signal.

Also, the (c) producing may be attained by selecting the selected clock signal from the N clock signals based on a first average falling edge phase data; by passing the N sampled data signals in response to the first selection signal; by comparing the selected clock signal and each of the N sampled data signals in phase to produce post-comparison data signals; by determining an average falling edge phase from the N sampled data signals to generate the first average falling edge phase data and a second average falling edge phase data; by determining an average rising edge phase from the N sampled data signals and the second average falling edge phase data; by detecting a duty of each of the N sampled data signals to produce duty data; by determining a data selection phase based on the average rising edge phase data and the duty data for the N sampled data signals; by selecting one from the post-comparison data signals which has a phase near to the data selection phase, to output the selected post-comparison data signal as a selection data signal; and by carrying out a re-timing operation to the selection data signal based on the selected clock signal to output to the output switching circuit.

Also, the (c) producing may be attained by selecting the selected clock signal from the N clock signals based on a first average falling edge phase data; by passing the N sampled data signals in response to the first selection signal; by comparing the selected clock signal and each of the N sampled data signals in phase to produce post-comparison data signals; by determining an average rising edge phase from the N sampled data signals to generate the first average rising edge phase data and a second average rising edge phase data; by determining an average falling edge phase from the N sampled data signals and the second average rising edge phase data; by detecting a duty of each of the N sampled data signals to produce duty data; by determining a data selection phase based on the average falling edge phase data and the duty data for the N sampled data signals; by selecting one from the post-comparison data signals which has a phase near to the data selection phase, to output the selected post-comparison data signal as a selection data signal; and by carrying out a re-timing operation to the selection data signal based on the selected clock signal.

Also, the (c) producing may be attained by selecting the selected clock signal from the N clock signals based on a first average falling edge phase data; by passing the N sampled data signals in response to the first selection signal; by comparing the selected clock signal and each of the N sampled data signals in phase to produce post-comparison data signals; by determining an average falling edge phase from the N sampled data signals to generate the first average falling edge phase data and a second average falling edge phase data; by determining an average rising edge phase from the N sampled data signals and the second average falling edge phase data; by determining a data selection phase based on the average rising edge phase data; by selecting one from the post-comparison data signals which has a phase near to the data selection phase, to output the selected post-comparison data signal as a selection data signal; and by carrying out a re-timing operation to the selection data signal based on the selected clock signal.

BRIEF DESCRIPTION OF THE DRAWINGS

FIGS. 6A to 6G are diagrams showing a separating operation to each of phases of internal circuits in the second embodiment of the present invention;

DESCRIPTION OF THE PREFERRED EMBODIMENTS

Hereinafter, a digital PLL circuit of the present invention will be described with reference to the attached drawings.

Figure 1:
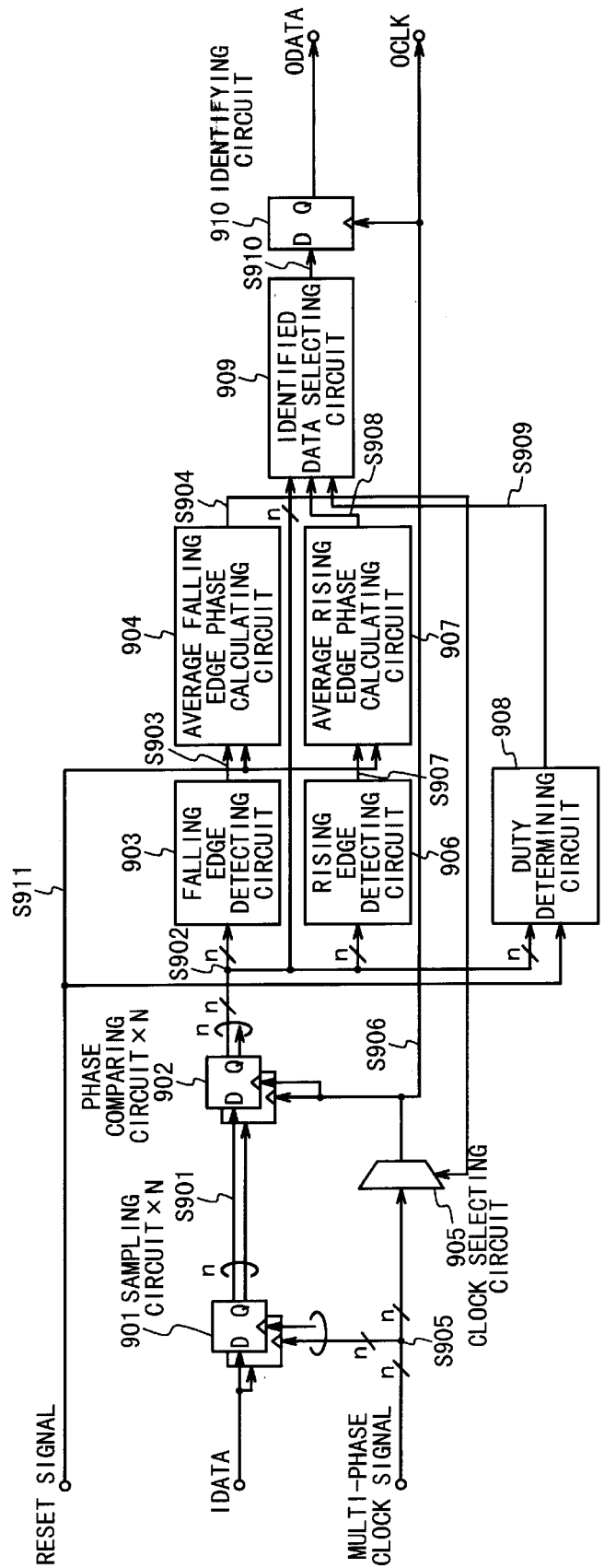
FIG. 1 is a diagram showing the structure of a conventional digital PLL circuit.
Figure 2:
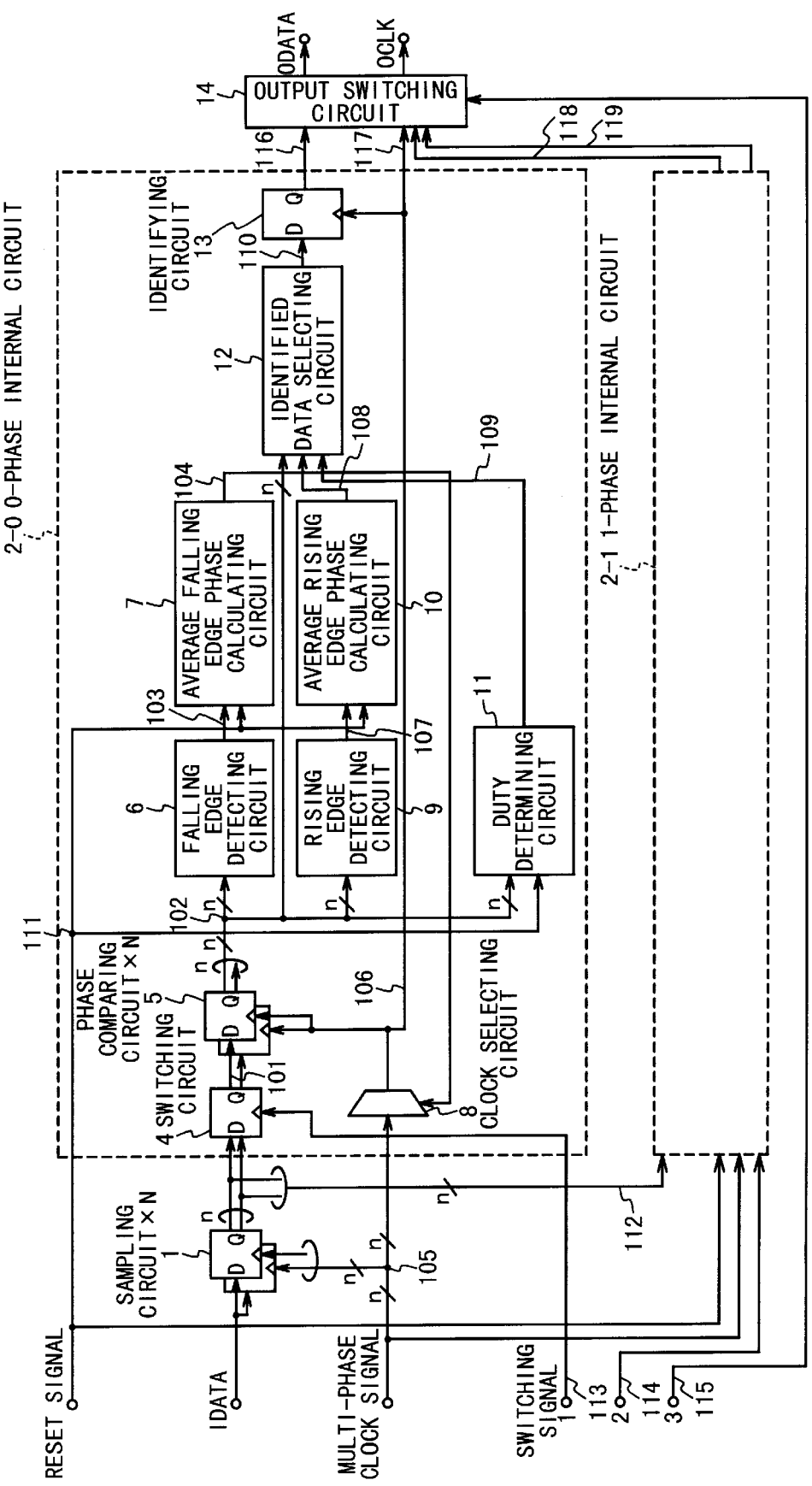
FIG. 2 is a block diagram showing the structure of a digital PLL circuit according to a first embodiment of the present invention.

FIG. 2 is a block diagram showing the structure of the digital PLL circuit according to the first embodiment of the present invention. Referring to FIG. 2, the digital PLL circuit in the first embodiment is composed of a sampling circuit 1, two phases of internal circuits, namely, a 0-phase internal circuit 2-0 and a 1-phase internal circuit 2-1, and an output switching circuit 14.

Each of the two phases of internal circuits 2-0 and 2-1 is composed of a switching circuit 4, a phase comparing circuit 5, a clock signal selecting circuit 8, a falling edge detecting circuit 6, an average falling edge phase calculating circuit 7, a rising edge detecting circuit 9, an average rising edge phase calculating circuit 10, a duty determining circuit 11, an identified data selecting circuit 12, and an identifying circuit 13.

In FIG. 2, the sampling circuit 1 is composed of n (n is an integer more than 1) flip-flop circuits. The sampling circuit 1 is supplied with a data signal IDATA and a multi-phase clock signal composed of n clock signals. Each of the n clock signals has substantially the same frequency as the data signal. Also, the n clock signals have different phases one after another by 360 degrees/n. The sampling circuit 1 carries out a data sampling operation to the data signal in response to the multi-phase clock signal to produce n sampled data signals 112 corresponding to the n clock signals.

The n sampling data signals 112 are supplied from the sampling circuit 1 to the 0-phase internal circuit 2-0 and the 1-phase internal circuit 2-1. Also, the 0-phase internal circuit 2-0 and the 1-phase internal circuit 2-1 are supplied with the switching signals 1 113 and 2 114, respectively. Because the 0-phase internal circuit 2-0 and the 1-phase internal circuit 2-1 have the same structure, only the 0-phase internal circuit 2-0 will be described below.

The switching circuit 4 is located on the input side of the 0-phase internal circuit 2-0. The switching circuit 4 passes the n sampled data signals 112 to the phase comparing circuit 5 as n sampled data signals 101 in response to the switching signal 1 113.

The clock signal selecting circuit 8 selects one of the n clock signals of the multi-phase clock signal 105 in response to a clock selection signal. The clock signal selecting circuit 8 supplies the selected clock signal 106 to the phase comparing circuit 5, the identifying circuit 13 and the output switching circuit 14.

The phase comparing circuit 5 is composed of n comparing circuit sections. The phase comparing circuit 5 compares each of the n sampled data signals 101 outputted from the switching circuit 4 and the selected clock signal 106 outputted from the clock signal selecting circuit 8 in phase. The phase comparing circuit 5 outputs n comparison resultant data signals 102 to the falling edge detecting circuit 6, the rising edge detecting circuit 9, the duty determining circuit 11, and the identified data selecting circuit 12.

Next, the falling edge detecting circuit 6 is composed of a combination circuit. The falling edge detecting circuit 6 detects a data 103 indicative of a falling edge from the n comparison resultant data signals 102 outputted from the phase comparing circuit 5 and outputs the falling edge data 103 to the average falling edge phase calculating circuit 7.

The average falling edge phase calculating circuit 7 is supplied with a reset signal 111 and the falling edge data 103. The reset signal 11 indicates the head of the burst data signal. The average falling edge phase calculating circuit 7 calculates a new average falling edge phase data 104 from the falling edge data 103 outputted from the falling edge detecting circuit 6, past average falling edge phase data and the number of past falling edge data in response to the reset signal 111. The average falling edge phase calculating circuit 7 increments the number of past falling edge data by "1" and stores the new average falling edge phase data 104 as the past average falling edge phase data. Also, the average falling edge phase calculating circuit 7 outputs the new average falling edge phase data 104 to the clock signal selecting circuit 8 as the clock selection signal.

The rising edge detecting circuit 9 detects a data 107 indicative of a rising edge 107 from the n comparison resultant data signals 102 outputted from the phase comparing circuit 5. The rising edge detecting circuit 9 outputs the rising edge data 107 to the average rising edge phase calculating circuit 10.

The average rising edge phase calculating circuit 10 is supplied with the reset signal 111 and the rising edge data 107. The average rising edge phase calculating circuit 10 calculates a new average rising edge phase data 108 from the rising edge data 107 outputted from the rising edge detecting circuit 9, past average rising edge phase data and the number of past rising edge data in response to the reset signal 111. The average rising edge phase calculating circuit 10 increments the number of past rising edge data by "1" and stores the new average rising edge phase data 108 as the past average rising edge phase data. Also, the average rising edge phase calculating circuit 10 outputs the new average rising edge phase data 108 to the identified data selecting circuit 12.

The duty determining circuit 11 is supplied with the n comparison resultant data signals 102 outputted from the phase comparing circuit 5 and the reset signal 111. The duty determining circuit 11 detects a duty based on the n comparison resultant data signals 102 in response to the reset signal 111 and outputs a duty data 109 indicative of the detected duty to the identified data selecting circuit 12.

The identified data selecting circuit 12 is supplied with the n sampled data signals 102, the average rising edge phase data 108 outputted from the average rising edge phase calculating circuit 10 and the duty data 109 outputted from duty determining circuit 11. The identified data selecting circuit 12 selects one as an identified data signal from among the n comparison resultant data signals 102 as an optimal identified data signal 110 based on the average rising edge phase data 108 and the duty data 109. The identified data signal 110 is outputted to the identifying circuit 13.

The identifying circuit 13 carries out a re-timing operation to the identified data signal 110 outputted in response to the selected clock signal 106 outputted from the clock signal selecting circuit 8. The identifying circuit outputs a re-timed data signal 116 to the output switching circuit 14.

Lastly, the output switching circuit 14 alternately selects the identified data signals 116 and 118 and the selected clock signals 117 and 119 for every burst data signal based on a switching signal 3 115. The selected data signal is outputted as ODATA and the selected clock signal is outputted as OCLK.

In this way, the 0-phase internal circuit 2-0 or the 1-phase internal circuit 2-1 are alternately activated to carry out a phase synchronizing operation and a data identifying operation. Generally, a processing time is necessary to carry out the phase synchronizing operation and the data identifying operation to the burst data signal in the digital PLL circuit. In the present invention, the overlap processing of the burst data signal is made possible by two phases of internal circuits so that the occurrence of the processing wait state can be prevented. As the result, the interval between the burst data signals can be made short without the degradation of reception characteristic.

Next, the digital PLL circuit according to the second embodiment of the present invention will be described with reference to FIG. 3. In the second embodiment, the same reference numerals as in the first embodiment are allocated to the same components as in the first embodiment. The digital PLL circuit in the second embodiment has the structure similar to the first embodiment.

Figure 3:
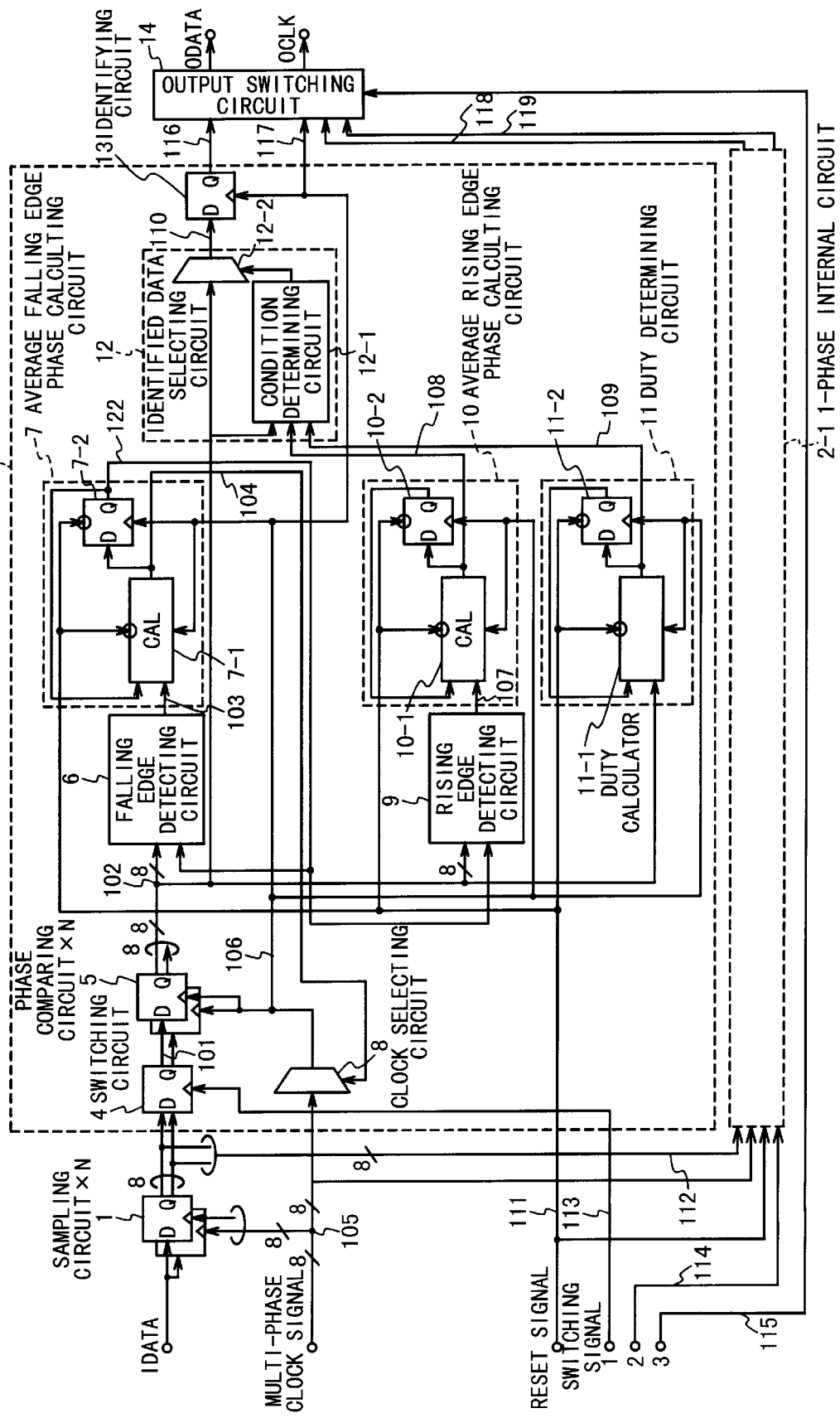
FIG. 3 is a block diagram showing the structure of a digital PLL circuit according to a second embodiment of the present invention.

In FIG. 3, the sampling circuit 1 is composed of eight flip-flop circuits. The sampling circuit 1 is supplied with a data signal IDATA and a multi-phase clock signal composed of 8 clock signals. Each of the 8 clock signals has substantially the same frequency as the data signal. The 8 clock signals have different phases from each other by 360 degrees/8. The sampling circuit 1 carries out a data sampling operation to the data signal in response to the multi-phase clock signal to produce 8 sampled data signals 112 corresponding to the 8 clock signals.

The 8 sampling data signals 112 are supplied from the sampling circuit 1 to the 0-phase internal circuit 2-0 and the 1-phase internal circuit 2-1. Also, each of the 0-phase internal circuit 2-0 and the 1-phase internal circuit 2-1 is supplied with the reset signal 111, the multi-phase clock signal 105, and the switching signals 1 113 and 2 114. Because the 0-phase internal circuit 2-0 and the 1-phase internal circuit 2-1 have the same structure, only the 0-phase internal circuit 2-0 will be described below.

The switching circuit 4 is located on the input side of the 0-phase internal circuit 2-0. The switching circuit 4 passes the 8 sampled data signals 112 to the phase comparing circuit 5 as 8 sampled data signals 101 in response to the switching signal 1 113.

The clock signal selecting circuit 8 selects one of the 8 clock signals of the multi-phase clock signal 105 in response to a clock selection signal. The clock signal selecting circuit 8 supplies the selected clock signal 106 to the phase comparing circuit 5, the average falling edge phase calculating circuit 7, the average rising edge phase calculating circuit 10, the identifying circuit 13, the duty determining circuit and the output switching circuit 14.

The phase comparing circuit 5 is composed of eight flip-flop circuits. The phase comparing circuit 5 compares each of the 8 sampled data signals 101 outputted from the switching circuit 4 and the selected clock signal 106 outputted from the clock signal selecting circuit 8 in phase. The phase comparing circuit 5 outputs 8 comparison resultant data signals 102 to the falling edge detecting circuit 6, the rising edge detecting circuit 9, the duty determining circuit 11, and the identified data selecting circuit 12.

The falling edge detecting circuit 6 is composed of a combination circuit. The falling edge detecting circuit 6 is supplied with the 8 comparison resultant data signals 102 and a past average falling edge phase data 122 from the average falling edge phase calculating circuit 7. The falling edge detecting circuit 6 detects a falling edge from the 8 comparison resultant data signals 102 and the past average falling edge phase data 122 and outputs a falling edge data 103 indicative of the detected falling edge to the average falling edge phase calculating circuit 7. The falling edge data 103 indicates a difference of a current falling edge phase data from the past average falling edge phase data 122.

The average falling edge phase calculating circuit 7 is composed of a calculating circuit 7-1 as a combination circuit and a storage circuit 7-2 of a flip-flop circuit. The average falling edge phase calculating circuit 7 is supplied with the reset signal 111, the falling edge data 103 and the selected clock signal 106. The reset signal 11 indicates the head of the burst data signal. The calculating circuit 7-1 of the average falling edge phase calculating circuit 7 calculates a current average falling edge phase data 104 from the falling edge data 103, past average falling edge phase data 112 and the number of past falling edge data in response to the selected clock signal 106. The calculating circuit 7-1 increments the number of past falling edge data by "1". Also, the calculating circuit 7-1 outputs the current average falling edge phase data 104 to the clock signal selecting circuit 8 as the clock selection signal and the storage circuit 7-2. The storage circuit 7-2 of the average falling edge phase calculating circuit 7 latches the current average falling edge phase data 104 in response to the selected clock signal 106 and outputs the latched average falling edge phase data 122 to the calculating circuit 7-1 and the falling edge detecting circuit 6 as the past average falling edge phase data 122 and to the rising edge detecting circuit 9 as the current average falling edge phase data 122. The calculating circuit 7-1 and the storage circuit 7-2 are reset in response to the reset signal 111.

The rising edge detecting circuit 9 is composed of a combination circuit. The rising edge detecting circuit 9 is supplied with the 8 comparison resultant data signals 102 outputted from the phase comparing circuit 5 and the current average falling edge phase data 122 from the average falling edge phase calculating circuit 7. The rising edge detecting circuit 9 detects a data 107 indicative of a rising edge 107 based on the 8 comparison resultant data signals 102 and the current average falling edge phase data 122. The rising edge detecting circuit 9 outputs the rising edge data 107 to the average rising edge phase calculating circuit 10. The digital PLL circuit in the second embodiment operates based on the falling edge, and therefore the rising edge phase is shown by a difference from the current average falling edge phase data 122.

The average rising edge phase calculating circuit 10 is composed of a calculating circuit 10-1 as a combination circuit and a storage circuit 10-2 of a flip-flop circuit. The average rising edge phase calculating circuit 10 is supplied with the reset signal 111, the rising edge data 107 and the selected clock signal 106. The calculating circuit 10-1 of the average rising edge phase calculating circuit 10 calculates a current average rising edge phase data 108 from the falling edge data 107, a past average rising edge phase data and the number of past rising edge data in response to the selected clock signal 106. The calculating circuit 10-1 increments the number of past rising edge data by "1". Also, the calculating circuit 10-1 outputs the current average rising edge phase data 108 to the identified data selecting circuit 12 and the storage circuit 10-2. The storage circuit 10-2 latches the current average rising edge phase data 107 in response to the selected clock signal 106 and outputs the latched average falling edge phase data to the calculating circuit 7-1 as the past average falling edge phase data. The calculating circuit 10-1 and the storage circuit 10-2 are reset in response to the reset signal 111.

The duty determining circuit 11 is composed of a calculating circuit 11-1 as a combination circuit and a storage circuit 11-2 of a flip-flop circuit. The duty determining circuit 11 is supplied with the 8 comparison resultant data signals 102 outputted from the phase comparing circuit 5, the reset signal 111 and the selected clock signal 106. The calculating circuit 11-1 of the duty determining circuit 11 detects a duty based on the 8 comparison resultant data signals 102 and a past duty data in response to the selected clock signal 106. Then, the calculating circuit 11-1 outputs a duty data 109 indicative of the detected duty to the identified data selecting circuit 12 and the storage circuit 11-2. The storage circuit 11-2 latches the duty data 109 in response to the selected clock signal 106 and outputs the latched duty data to the calculating circuit 11-1 as the past duty data. The calculating circuit 11-1 and the storage circuit 7-2 are reset in response to the reset signal 111.

Next, the duty determining circuit 11 extracts the alternate data of "1" and "0" which are positioned at the head of the input data signal based on the comparison resultant data signals 102 outputted from the phase comparing circuit 5 and a reset signal 111 indicating the head of the burst data signal. The duty determining circuit 11 calculates the interval of "1" and the interval of "0", and detects the the duty data 109. Here, the definition of the duty of the input data is classified into three cases such as a case of the input data 1 of 100%, a case of the input data 2 above 100%, and the input data 3 is less than 100%, as shown in FIGS. 7A to 7D.

The identified data selecting circuit 12 is composed of a condition determining circuit 12-1 and a selector circuit 12-2. The conditional determining circuit 12-1 is supplied with the 8 comparison resultant data signals 102, the average rising edge phase data 108 and the duty data 109. The conditional determining circuit 12-1 generates a selector selection signal from the 8 comparison resultant data signals 102, the average rising edge phase data 108 and the duty data 109. The selector circuit 12-2 selects one from among the 8 comparison resultant data signals 102 as an optimal identified data signal 110 based on the selector selection signal from the condition determining circuit 12-1. The identified data signal 110 is outputted to the identifying circuit 13.

The identifying circuit 13 carries out a re-timing operation to the identified data signal 110 outputted from the identified data selecting circuit 12 in response to the selected clock signal 106 outputted from the clock signal selecting circuit 8. The identifying circuit outputs a re-timed data signal 116 to the output switching circuit 14.

Lastly, the output switching circuit 14 alternately selects the identified data signals 116 and 118 and the selected clock signals 117 and 119 from the internal circuits 2-0 and 2-1 for every burst data signal based on the switching signal 3 115. The selected data signal is outputted as ODATA and the selected clock signal is outputted as OCLK.

Figure 4:
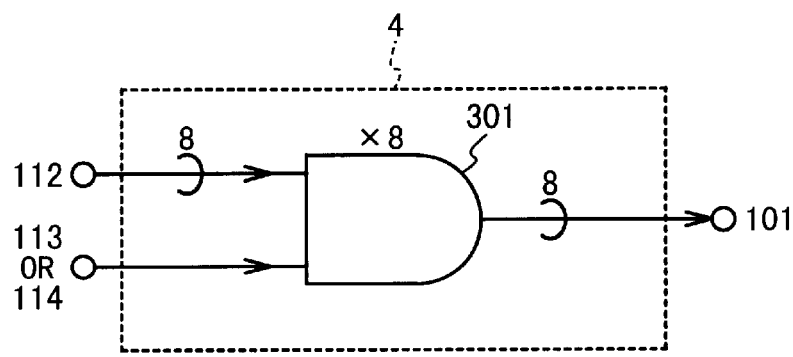
FIG. 4 is a block diagram showing the structure of a switching circuit of FIG. 3 in the second embodiment of the present invention.

FIG. 4 shows the structure of the switching circuit 4 of the present invention. Referring to FIG. 4, the switching circuit 4 is composed of a gate circuit 301 of 8 AND gates. The switching circuit 4 controls the input of the 8 sampled data signals 112 to the phase sampling circuit 5 based on the switching signal 113 or 114.

Figure 5:
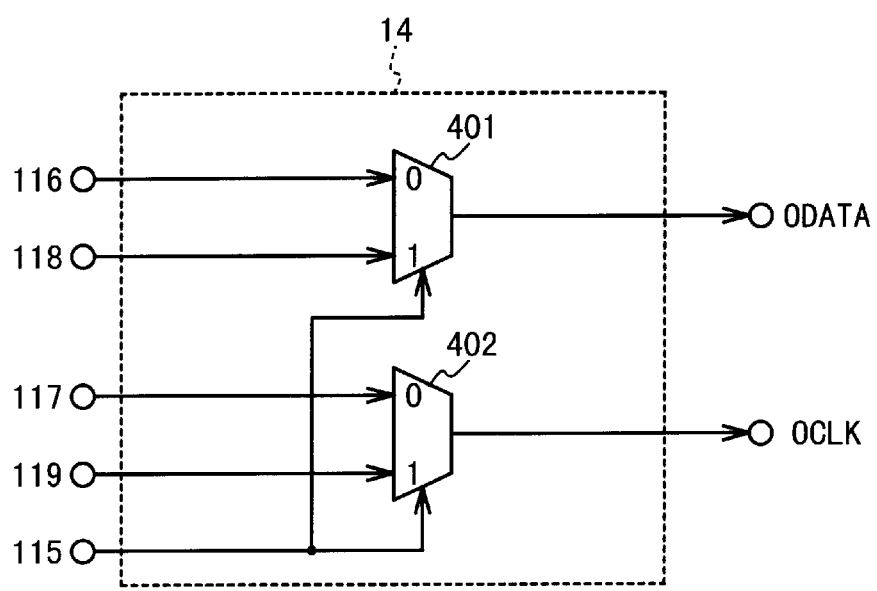
FIG. 5 is a block diagram showing the structure of an output switching circuit of FIG. 3 in the first embodiment of the present invention.
Figures 7A, 7B, 7C, 7D:
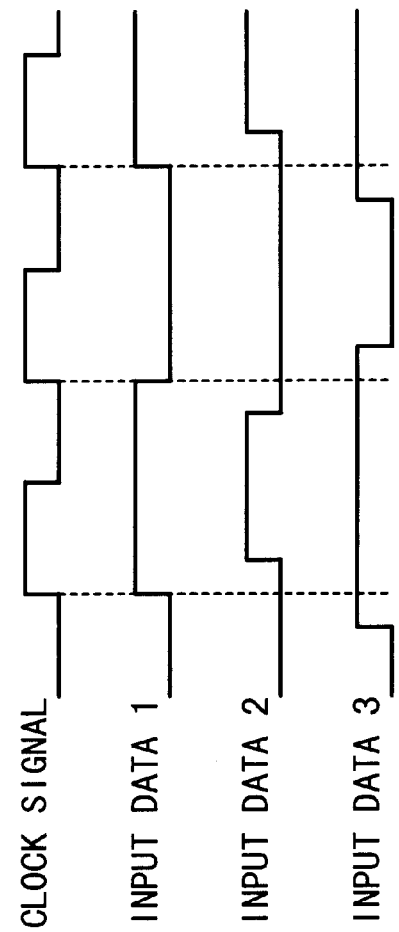
FIGS. 7A to 7D are diagrams showing the definition a duty of an input data.

FIG. 5 shows the structure of the output switching circuit 14 of the present invention. Referring to FIG. 5, the output switching circuit 14 is composed of gate circuits 401 and 402. The gate circuits 401 and 402 select one of the identified data signals 116 and 118, and one of the selected clock signals 117 and 119 based on the switching signal 3 115, respectively.

The division of the burst data signal to each phase is carried out by controlling the switching circuit 4 located on the input side of internal circuit 2-0 or 2-1 based on the switching signal 1 113 or the switching signal 2 114, as shown in FIG. 5. Also, the selection of the identified data signals 116 and 118 outputted from the internal circuits 2-0 and 2-1 is carried out by controlling the output switching circuit 14 based on the switching signal 3 115.

Next, the operation of the digital PLL circuit in the second embodiment of the present invention will be described in detail with reference to FIGS. 6A to 6G.

In the present invention, the phase switching operation of the 2-phase structure is carried out by the switching circuits 4 located on the input side of the 0-phase internal circuit 2-0 and the 1-phase internal circuit 2-1 and the output switching circuit 14 located on the output side from the 0-phase internal circuit 2-0 and the 1-phase internal circuit 2-1.

In the conventional digital PLL circuit, the phase synchronizing operation and the data identifying operation to the burst data signal supplied as IDATA are carried out sequentially to get the identified data signal. The processing time is also necessary. For this reason, a processing wait state occurs to the next burst data signal until the identified data signal is obtained when the burst data signal is supplied.

However, in the present invention, as shown in FIGS. 6A to 6G, the 2-phase circuit structure is adopted and the burst data signals are separated into the respective phases. Therefore, the phase synchronizing operation and the data identifying operation are carried out in each phase. Thus, the identified data signal outputted from the respective phases are alternately selected and outputted. In this way, the occurrence of the processing wait can be prevented.

Next, the digital PLL circuit according to the third embodiment of the present invention will be described with reference to FIG. 8. The basic structure of the digital PLL circuit in the third embodiment is the same as in the second embodiment. However, the positions of the rising edge detecting circuit 706, average rising edge phase calculating circuit 707, falling edge detecting circuit 709, and average falling edge phase calculating circuit 710 are changed.

Figure 8:
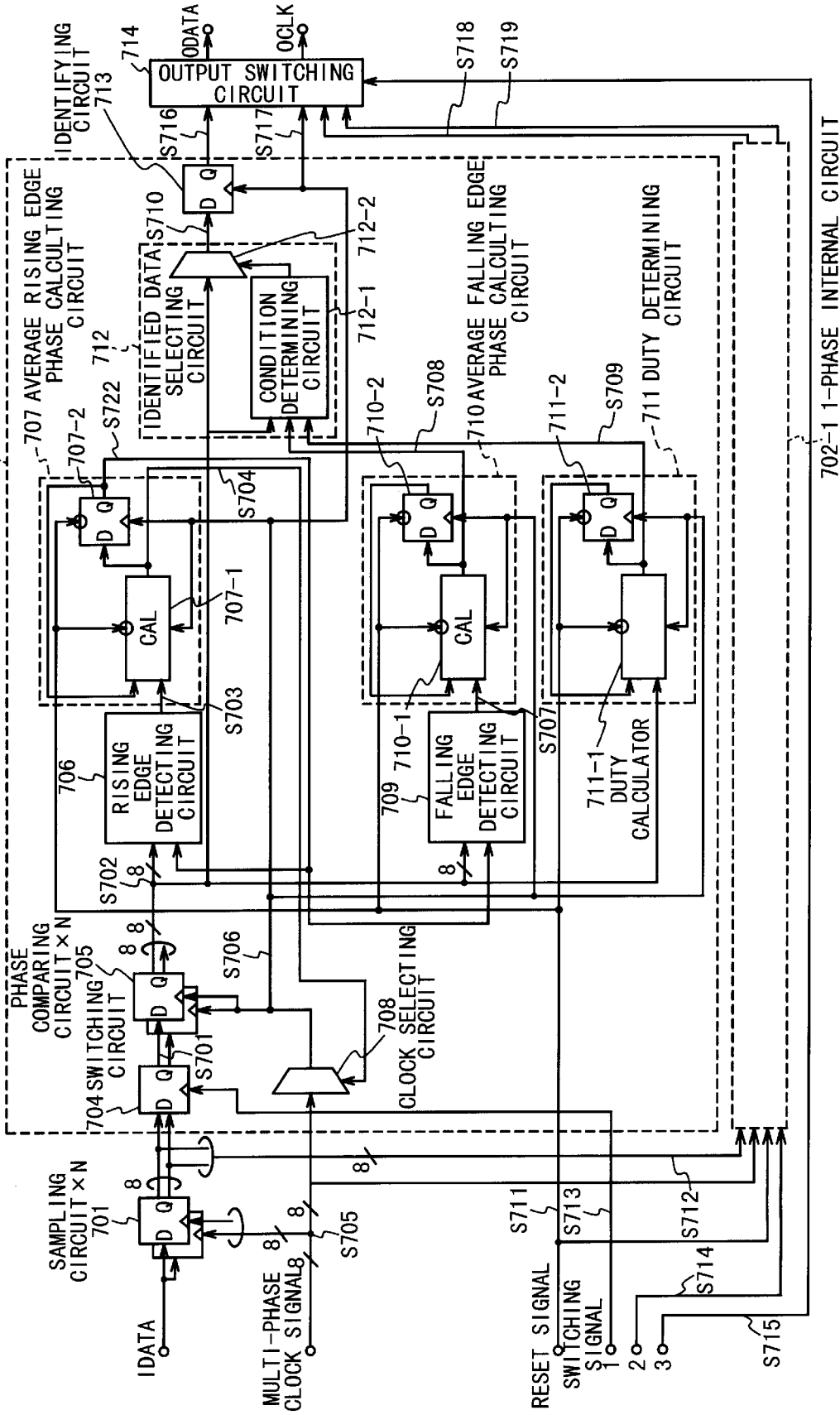
FIG. 8 is a block diagram showing the structure of the digital PLL circuit according to a third embodiment of the present invention.

Referring to FIG. 8, the sampling circuit 701 is composed of n (n is an integer more than) flip-flop circuits. The sampling circuit 701 is supplied with a data signal IDATA and a multi-phase clock signal S705 composed of n clock signals. Each of the n clock signals has substantially the same frequency as the data signal. The n clock signals have different phases from each other by 360 degrees/n. The sampling circuit 1 carries out a data sampling operation to the data signal in response to the multi-phase clock signal S705 to produce 8 sampled data signals S712 corresponding to the 8 clock signals.

The n sampling data signals S712 are supplied from the sampling circuit 1 to the 0-phase internal circuit 702-0 and the 1-phase internal circuit 702-1. Also, the 0-phase internal circuit 702-0 and the 1-phase internal circuit 702-1 are supplied with the switching signals 1 713 and 2 714, respectively. Because the 0-phase internal circuit 702-0 and the 1-phase internal circuit 702-1 have the same structure, only the 0-phase internal circuit 702-0 will be described below.

The switching circuit 704 is located on the input side of the 0-phase internal circuit 702-0. The switching circuit 704 passes the n sampled data signals S712 to the phase comparing circuit 705 as n sampled data signals S701 in response to the switching signal 1 713.

The clock signal selecting circuit 708 selects one of the n clock signals of the multi-phase clock signal S705 in response to a clock selection signal. The clock signal selecting circuit 708 supplies the selected clock signal S706 to the phase comparing circuit 705, the average falling edge phase calculating circuit 707, the average rising edge phase calculating circuit 710, the identifying circuit 713 and the output switching circuit 714.

The phase comparing circuit 705 is composed of n flip-flop circuits. The phase comparing circuit 705 compares each of the n sampled data signals S701 outputted from the switching circuit 704 and the selected clock signal S706 outputted from the clock signal selecting circuit 708 in phase. The phase comparing circuit 705 outputs n comparison resultant data signals S702 to the falling edge detecting circuit 709, the rising edge detecting circuit 706, the duty determining circuit 711, and the identified data selecting circuit 712.

The rising edge detecting circuit 706 is composed of a combination circuit. The rising edge detecting circuit 706 is supplied with the n comparison resultant data signals S702 outputted from the phase comparing circuit 705 and a past average rising edge phase data S722 from the average rising edge phase calculating circuit 707. The rising edge detecting circuit 706 detects a rising edge from the n comparison resultant data signals S702 and the past average falling edge phase data S722 and outputs a rising edge data S703 indicative of the detected rising edge to the average rising edge phase calculating circuit 707. The rising edge data S703 indicates a difference of a current rising edge phase data from the past average rising edge phase data.

The average rising edge phase calculating circuit 707 is composed of a calculating circuit 707-1 as a combination circuit and a storage circuit 707-2 of a flip-flop circuit. The average rising edge phase calculating circuit 707 is supplied with the reset signal S711, the falling edge data S703 and the selected clock signal S706. The reset signal S711 indicates the head of the burst data signal. The calculating circuit 707-1 of the average falling edge phase calculating circuit 707 calculates the current average rising edge phase data 104 from the rising edge data S703, the past average falling edge phase data S722 and the number of past rising edge data in response to the selected clock signal S706. The calculating circuit 707-1 increments the number of past falling edge data by "1". Also, the calculating circuit 707-1 outputs the current average falling edge phase data S704 to the clock signal selecting circuit 708 as the clock selection signal and the storage circuit 707-2. The storage circuit 707-2 of the average falling edge phase calculating circuit 707 latches the current average falling edge phase data S704 in response to the selected clock signal S706. Then, the storage circuit 707-2 outputs the latched average falling edge phase data S722 to the calculating circuit 707-1 and the rising edge detecting circuit 706 as the past average falling edge phase data S722 and to the falling edge detecting circuit 709 as current average falling edge phase data S722. The calculating circuit 707-1 and the storage circuit 707-2 are reset in response to the reset signal S711.

The falling edge detecting circuit 709 is composed of a combination circuit. The falling edge detecting circuit 709 is supplied with the n comparison resultant data signals S702 outputted from the phase comparing circuit 705 and the latched average rising edge phase data S722 from the average rising edge phase calculating circuit 707. The falling edge detecting circuit 709 detects a data 107 indicative of a falling edge based on the n comparison resultant data signals S702 and the latched average rising edge phase data S722. The falling edge detecting circuit 709 outputs the falling edge data S707 to the average falling edge phase calculating circuit 710. The digital PLL circuit in the third embodiment operates based on the rising edge, and therefore the falling edge phase is shown by a difference from the average rising edge phase data S722.

The average falling edge phase calculating circuit 710 is composed of a calculating circuit 710-1 as a combination circuit and a storage circuit 710-2 of a flip-flop circuit. The average rising edge phase calculating circuit 710 is supplied with the reset signal S711, the falling edge data S707 and the selected clock signal S706. The calculating circuit 710-1 of the average falling edge phase calculating circuit 710 calculates the current average falling edge phase data S704 from the falling edge data S707, a past average falling edge phase data and the number of past falling edge data in response to the selected clock signal S706. The calculating circuit 710-1 increments the number of past falling edge data by "1". Also, the calculating circuit 710-1 outputs the current average falling edge phase data S708 to the identified data selecting circuit 712 and the storage circuit 710-2. The storage circuit 710-2 latches the current average falling edge phase data S707 in response to the selected clock signal S706 and outputs the latched average falling edge phase data S722 to the calculating circuit 710-1 as the past average falling edge phase data. The calculating circuit 710-1 and the storage circuit 710-2 is reset in response to the reset signal S711.

The duty determining circuit 711 is composed of a calculating circuit 711-1 as a combination circuit and a storage circuit 711-2 of a flip-flop circuit. The duty determining circuit 711 is supplied with the n comparison resultant data signals S702 outputted from the phase comparing circuit 705, the reset signal S711 and the selected clock signal S706. The calculating circuit 711-1 of the duty determining circuit 711 detects a duty based on the n comparison resultant data signals S702 and a past duty data in response to the selected clock signal S706. Also, the calculating circuit 711-1 outputs a duty data S709 indicative of the detected duty to the identified data selecting circuit 712 and the storage circuit 711-2. The storage circuit 711-2 latches the duty data S709 in response to the selected clock signal S706 and outputs the latched duty data to the calculating circuit 707-1 as the past duty data. The calculating circuit 711-1 and the storage circuit 711-2 are reset in response to the reset signal S711.

The identified data selecting circuit 712 is composed of a condition determining circuit 712-1 and a selector circuit 712-2. The conditional determining circuit 712-1 is supplied with the n comparison resultant data signals S702, the average rising edge phase data S708 and the duty data S709. The conditional determining circuit 712-1 generates a selector selection signal from the n comparison resultant data signals S702, the average falling edge phase data S708 and the duty data S709. The selector circuit 712-2 selects one from among the n comparison resultant data signals S702 as an optimal identified data signal S710 on the selector selection signal from the condition determining circuit 712-1. The identified data signal S710 is outputted to the identifying circuit 713.

The identifying circuit 713 carries out a re-timing operation to the identified data signal S710 outputted from the identified data selecting circuit 712 in response to the selected clock signal S706 outputted from the clock signal selecting circuit 708. The identifying circuit outputs a re-timed data signal 116 to the output switching circuit 714.

Lastly, the output switching circuit 714 alternately selects the identified data signals 116 and 118 and the selected clock signals 117 and 119 from the internal circuits 702-0 and 702-1 for every burst data signal based on the switching signal 3 S715. The selected data signal is outputted as ODATA and the selected clock signal is outputted as OCLK.

In the third embodiment, the clock signal selection by the clock signal selecting circuit 708 is carried out based on the rising edge. Therefore, the third embodiment is effective, when a jitter quantity at the rising edge is less than a jitter quantity at the falling edge.

Next, the digital PLL circuit according to the fourth embodiment of the present invention will be described with reference to FIG. 9. In the above first to third embodiments, the shortening of the interval between the burst data signals is attained through adoption of 2-phase internal circuits without loss of jitter endurance characteristic and duty change endurance. However, there is a case that the shortening of burst data signal interval, the reduction of circuit scale and low power consumption should be attained, even if the jitter endurance characteristic and the duty change endurance characteristic are degraded. Such a structure is shown in FIG. 9 as the fourth embodiment.

Figure 9:
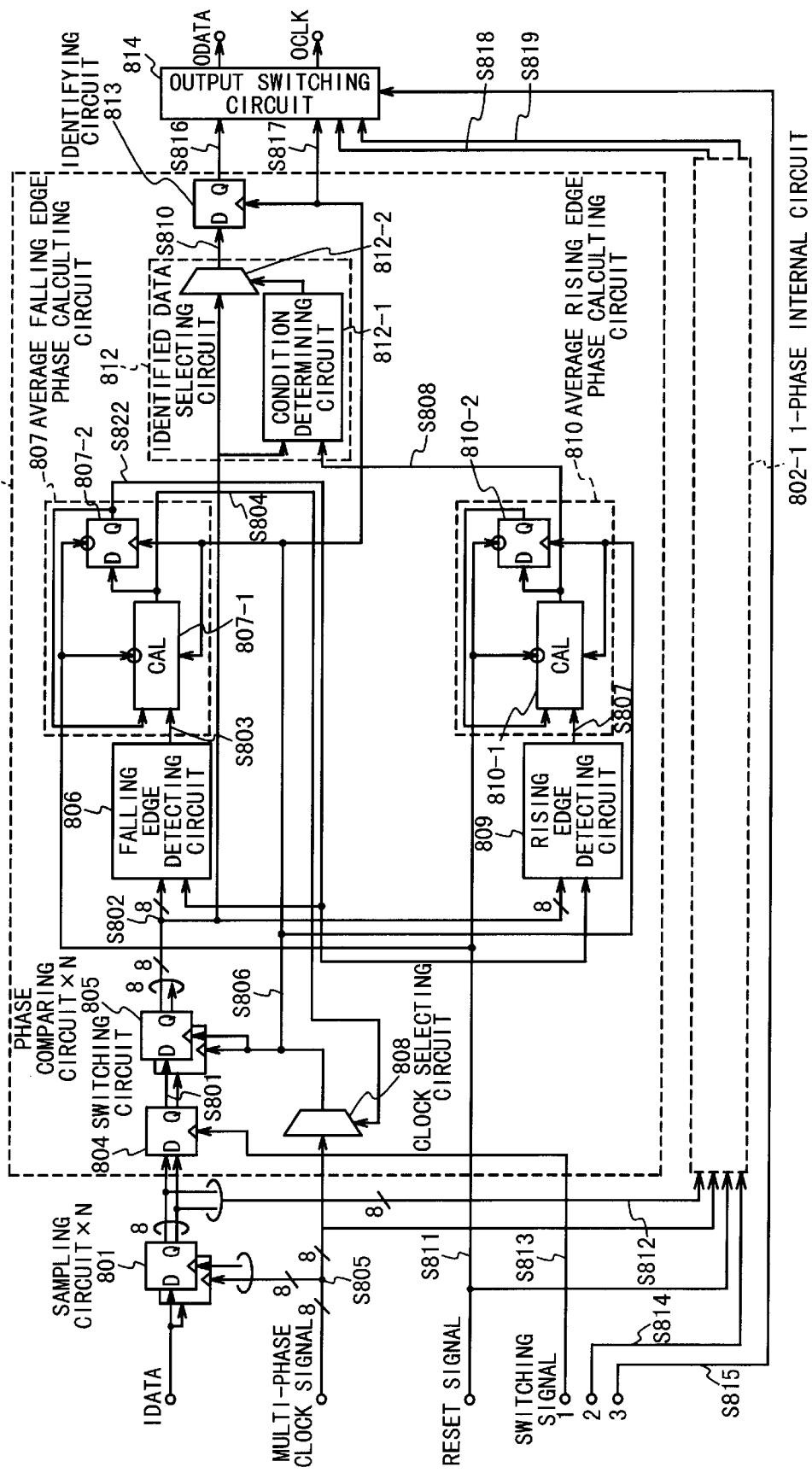
FIG. 9 is block diagram showing the structure of the digital PLL circuit according to a fourth embodiment of the present invention.

Referring to FIG. 9, the sampling circuit 801 is composed of eight flip-flop circuits. The sampling circuit 801 is supplied with a data signal IDATA and a multi-phase clock signal S805 composed of 8 clock signals. Each of the 8 clock signals has substantially the same frequency as the data signal. The 8 clock signals have different phases from each other by 360 degrees/8. The sampling circuit 801 carries out a data sampling operation to the data signal in response to the multi-phase clock signal to produce 8 sampled data signals S812 corresponding to the 8 clock signals.

The 8 sampling data signals S812 are supplied from the sampling circuit 801 to the 0-phase internal circuit 802-0 and the 1-phase internal circuit 802-1. Also, the 0-phase internal circuit 802-0 and the 1-phase internal circuit 802-1 are supplied with the switching signals 1 813 and 2 S814, respectively. Because the 0-phase internal circuit 802-0 and the 1-phase internal circuit 802-1 have the same structure, only the 0-phase internal circuit 802-0 will be described below.

The switching circuit 804 is located on the input side of the 0-phase internal circuit 802-0. The switching circuit 804 passes the 8 sampled data signals S812 to the phase comparing circuit 805 as 8 sampled data signals S801 in response to the switching signal 1 S813.

The clock signal selecting circuit 808 selects one of the 8 clock signals of the multi-phase clock signal S805 in response to a clock selection signal. The clock signal selecting circuit 808 supplies the selected clock signal S806 to the phase comparing circuit 805, the average falling edge phase calculating circuit 807, the average rising edge phase calculating circuit 810, the identifying circuit 813 and the output switching circuit 814.

The phase comparing circuit 805 is composed of eight flip-flop circuits. The phase comparing circuit 805 compares each of the 8 sampled data signals S801 outputted from the switching circuit 804 and the selected clock signal S806 outputted from the clock signal selecting circuit 808 in phase. The phase comparing circuit 805 outputs 8 comparison resultant data signals S802 to the falling edge detecting circuit 806, the rising edge detecting circuit 809, the duty determining circuit 811, and the identified data selecting circuit 812.

The falling edge detecting circuit 806 is composed of a combination circuit. The falling edge detecting circuit 806 is supplied with the 8 comparison resultant data signals S802 outputted from the phase comparing circuit 805 and a past average falling edge phase data S822 from the average falling edge phase calculating circuit 807. The falling edge detecting circuit 806 detects a falling edge from the 8 comparison resultant data signals S802 and the past average falling edge phase data S822 and outputs a falling edge data S803 indicative of the detected falling edge to the average falling edge phase calculating circuit 807. The falling edge data S803 indicates a difference of a current falling edge phase data from the past average falling edge phase data.

The average falling edge phase calculating circuit 807 is composed of a calculating circuit 807-1 as a combination circuit and a storage circuit 807-2 of a flip-flop circuit. The average falling edge phase calculating circuit 807 is supplied with the reset signal S811, the falling edge data S803 and the selected clock signal S806. The reset signal 11 indicates the head of the burst data signal. The calculating circuit 807-1 of the average falling edge phase calculating circuit 807 calculates a current average falling edge phase data S804 from the falling edge data S803, past average falling edge phase data S822 and the number of past falling edge data in response to the selected clock signal S806. The calculating circuit 807-1 increments the number of past falling edge data by "1". Also, the calculating circuit 807-1 outputs the current average falling edge phase data S804 to the clock signal selecting circuit 808 as the clock selection signal and the storage circuit 807-2. The storage circuit 807-2 of the average falling edge phase calculating circuit 807 latches the current average falling edge phase data S804 in response to the selected clock signal S806 and outputs the latched average falling edge phase data S812 to the calculating circuit 807-1 and the falling edge detecting circuit 806 as the past average falling edge phase data S822 and to the rising edge detecting circuit 809 as the current average falling edge phase data S822. The calculating circuit 807-1 and the storage circuit 807-2 are reset in response to the reset signal S811.

The rising edge detecting circuit 809 is composed of a combination circuit. The rising edge detecting circuit 809 is supplied with the 8 comparison resultant data signals S802 outputted from the phase comparing circuit 805 and the latched average falling edge phase data S822 from the average falling edge phase calculating circuit 807. The rising edge detecting circuit 809 detects a data S807 indicative of a rising edge S807 based on the 8 comparison resultant data signals S802 and the latched average falling edge phase data S822. The rising edge detecting circuit 809 outputs the rising edge data S807 to the average rising edge phase calculating circuit 810. The digital PLL circuit in the fourth embodiment operates based on the falling edge, and therefore the rising edge phase is shown by a difference from the average falling edge phase data S822.

The average rising edge phase calculating circuit 810 is composed of a calculating circuit 810-1 as a combination circuit and a storage circuit 810-2 of a flip-flop circuit. The average rising edge phase calculating circuit 810 is supplied with the reset signal S811, the rising edge data S807 and the selected clock signal S806. The calculating circuit 810-1 of the average rising edge phase calculating circuit 810 calculates a new average rising edge phase data S804 from the falling edge data S807, past average rising edge phase data and the number of past rising edge data in response to the reset signal S811. The calculating circuit 810-1 increments the number of past rising edge data by "1". Also, the calculating circuit 810-1 outputs the current average rising edge phase data S808 to the identified data selecting circuit 812 and the storage circuit 810-2. The storage circuit 810-2 latches the current average rising edge phase data S808 in response to the selected clock signal S806 and outputs the latched average falling edge phase data to the calculating circuit 807-1 as the current average falling edge phase data. The calculating circuit 810-1 and the storage circuit 810-2 are reset in response to the reset signal S811.

The identified data selecting circuit 812 is composed of a condition determining circuit 812-1 and a selector circuit 812-2. The conditional determining circuit 812-1 is supplied with the 8 comparison resultant data signals S802 and the current average rising edge phase data S808. The conditional determining circuit 812-1 generates a selector selection signal from the 8 comparison resultant data signals S802 and the current average rising edge phase data S808. The selector circuit 812-2 selects one from among the 8 comparison resultant data signals S802 as an optimal identified data signal S810 based on the selector selection signal from the condition determining circuit 812-1. The identified data signal S810 is outputted to the identifying circuit 813.

The identifying circuit 813 carries out a re-timing operation to the identified data signal S810 outputted from the identified data selecting circuit 812 in response to the selected clock signal S806 outputted from the clock signal selecting circuit 808. The identifying circuit outputs a re-timed data signal 116 to the output switching circuit 814.

Lastly, the output switching circuit 814 alternately selects the identified data signals 116 and 118 and the selected clock signals 117 and 119 from the internal circuits 802-0 and 802-1 for every burst data signal based on the switching signal 3 S815. The selected data signal is outputted as ODATA and the selected clock signal is outputted as OCLK.

In this embodiment, the 0-phase internal circuit 802-0 and the 1-phase internal circuit 802-1 are simplified in structure, and the circuit scale reduction and the low power consumption can be realized. Moreover, it is possible to simplify the rising edge detecting circuit 809 and the average rising edge phase calculating circuit 810 in this embodiment.

In the above embodiments, although 8 phases (n=8) are used, the number of phases is not limited to 8.

As described above, according to the digital PLL circuit of the present invention, a plurality of internal circuits are adopted. Therefore, when the plurality of internal circuits are alternately used, there is no processing wait time, even if the processing time of phase synchronizing operation and data identifying operation to the burst data signal becomes long. Also, because it is not necessary to reduce the processing time of phase synchronizing operation and data identifying operation, a high jitter endurance characteristic, a high duty change endurance characteristic and abridgment between the burst data can be accomplished at the same time.

What is claimed is:

1. A digital PLL (phase locked loop) circuit comprising:
a sampling circuit sampling a burst data signal in response to a multi-phase clock signal to produce N (N is a positive integer larger than one) sampled data signals, said multi-phase clock signal including N clock signals, each of which has substantially the same frequency as said data signal and which have phases different by a predetermined component from one after another;
a plurality of internal circuits, each of which is selected in response to a first selection signal, and outputting a set of a selected one of said N clock signals and an identified data signal from said N sampled data signals, which corresponds to said selected one of said N clock signals, in response to said selected one of said N clock signals, when said internal circuit is selected; and
an output switching circuit selecting said set corresponding to said selected internal circuit from among said set from said plurality of internal circuits based on a second selection signal.

2. A digital PLL circuit according to claim 1, wherein said digital PLL circuit includes two internal circuits, and said first selection signal is supplied to said two internal circuits such that said two internal circuits operate alternately for every said data signal.

3. A digital PLL circuit according to claim 2, wherein said output switching circuit outputs said set of said selected one of said N clock signals and said identified data signal from said two internal circuits alternately for every said data signal.

4. A digital PLL circuit according to claim 1, wherein each of said plurality of internal circuits comprises:
a clock signal selecting circuit selecting said selected one of said N clock signals based on an average falling edge phase data, and outputting said selected one of said N clock signals to said output switching circuit;
a switching circuit passing said N sampled data signals in response to said first selection signal;
a phase comparing circuit comparing said selected one of said N clock signals and each of said N sampled data signals in phase to output post-comparison data signals;
an average falling edge phase determining section determining an average falling edge phase from said N sampled data signals to output said average falling edge phase data to said clock signal selecting circuit;

an average rising edge phase determining section determining an average rising edge phase from said N sampled data signals to output an average rising edge phase data;

a duty detecting circuit detecting a duty of each of said N sampled data signals to produce duty data;

an identifying circuit determining a data selection phase based on said average rising edge phase data and said duty data for said N sampled data signals, selecting one of said post-comparison data signals which has a phase near to said data selection phase, and outputting said selected post-comparison data signal as a selection data signal; and a re-timing circuit carrying out a re-timing operation to said selection data signal based on said selected one of said N clock signals to output to said output switching circuit.

5. A digital PLL circuit according to claim 1, wherein each of said plurality of internal circuits comprises:

a clock signal selecting circuit selecting said selected one of said N clock signals based on a first average falling edge phase data, and outputting said selected one of said N clock signals to said output switching circuit;

a switching circuit passing said N sampled data signals in response to said first selection signal;

a phase comparing circuit comparing said selected one of said N clock signals and each of said N sampled data signals in phase to output post-comparison data signals;

an average falling edge phase determining section determining an average falling edge phase from said N sampled data signals to generate said first average falling edge phase data and a second average falling edge phase data, and outputting said first average falling edge phase data to said clock signal selecting circuit;

an average rising edge phase determining section determining an average rising edge phase from said N sampled data signals and said second average falling edge phase data to output an average rising edge phase data;

a duty detecting circuit detecting a duty of each of said N sampled data signals to produce duty data;

an identifying circuit determining a data selection phase based on said average rising edge phase data and said duty data for said N sampled data signals, selecting one of said post-comparison data signals which has a phase near to said data selection phase, and outputting said selected post-comparison data signal as a selection data signal; and a re-timing circuit carrying out a re-timing operation to said selection data signal based on said selected one of said N clock signals to output to said output switching circuit.

6. A digital PLL circuit according to claim 1, wherein each of said plurality of internal circuits comprises:

a clock signal selecting circuit selecting said selected one of said N clock signals based on a first average falling edge phase data, and outputting said selected one of said N clock signals to said output switching circuit;

a switching circuit passing said N sampled data signals in response to said first selection signal;

a phase comparing circuit comparing said selected one of said N clock signals and each of said N sampled data signals in phase to output post-comparison data signals;

an average rising edge phase determining section determining an average rising edge phase from said N sampled data signals to generate said first average rising edge phase data and a second average rising edge phase data, and outputting said first average rising edge phase data to said clock signal selecting circuit;

an average falling edge phase determining section determining an average falling edge phase from said N sampled data signals and said second average rising edge phase data to output said first average falling edge phase data;

a duty detecting circuit detecting a duty of each of said N sampled data signals to produce duty data;

an identifying circuit determining a data selection phase based on said average falling edge phase data and said duty data for said N sampled data signals, selecting one of said post-comparison data signals which has a phase near to said data selection phase, and outputting said selected post-comparison data signal as a selection data signal; and a re-timing circuit carrying out a re-timing operation to said selection data signal based on said selected one of said N clock signals to output to said output switching circuit.

7. A digital PLL circuit according to claim 1, wherein each of said plurality of internal circuits comprises:

a clock signal selecting circuit selecting said selected one of said N clock signals based on a first average falling edge phase data, and outputting said selected one of said N clock signals to said output switching circuit;

a switching circuit passing said N sampled data signals in response to said first selection signal;

a phase comparing circuit comparing said selected one of said N clock signals and each of said N sampled data signals in phase to output post-comparison data signals;

an average falling edge phase determining section determining an average falling edge phase from said N sampled data signals to generate said first average falling edge phase data and a second average falling edge phase data, and outputting said first average falling edge phase data to said clock signal selecting circuit;

an average rising edge phase determining section determining an average rising edge phase from said N sampled data signals and said second average falling edge phase data to output an average rising edge phase data;

an identifying circuit determining a data selection phase based on said average rising edge phase data, selecting one from said post-comparison data signals which has a phase near to said data selection phase, and outputting said selected post-comparison data signal as a selection data signal; and a re-timing circuit carrying out a re-timing operation to said selection data signal based on said selected one of said N clock signals to output to said output switching circuit.

8. A method of reducing a time interval between burst data signals in a digital PLL (phase locked loop) circuit, comprising:

(a) sampling a burst data signal in response to a multi-phase clock signal to produce N (N is a positive integer larger than one) sampled data signals, said multi-phase clock signal including N clock signals, each of which has substantially the same frequency as said data signal and which have phases different by a predetermined component from one after another;

(b) selecting one of a plurality of internal circuits other than a currently used internal circuit in response to a first selection signal;

(c) producing a set of a selected one of said N clock signals and an identified data signal from said N sampled data signals in response to said selected one of said N clock signals in said selected internal circuit; and (d) selecting one of said set from said plurality of internal circuits based on a second selection signal.

9. A method according to claim 8, wherein said digital PLL circuit includes two internal circuits, and said (b) selecting includes:

supplying said first selection signals to said two internal circuits such that said two internal circuits operate alternately for every said data signal.

10. A method according to claim 9, wherein said (d) selecting includes:

supplying said second selection signal such that said set of said selected one of said N clock signals and said identified data signal are selected from said two internal circuits alternately for every said data signal.

11. A method according to claim 8, wherein said (c) producing includes:

selecting said selected one of said N clock signals based on an average falling edge phase data;

passing said N sampled data signals in response to said first selection signal;

comparing said selected one of said N clock signals and each of said N sampled data signals in phase to produce post-comparison data signals;

determining an average falling edge phase from said N sampled data signals;

determining an average rising edge phase from said N sampled data signals;

detecting a duty of each of said N sampled data signals to produce duty data;

determining a data selection phase based on an average rising edge phase data and said duty data for said N sampled data signals;

selecting one from said post-comparison data signals which has a phase near to said data selection phase, to output said selected post-comparison data signal as a selection data signal; and carrying out a re-timing operation to said selection data signal based on said said selected one of said N clock signals.

12. A method according to claim 8, wherein said (c) producing includes:

selecting said selected one of said N clock signals based on a first average falling edge phase data;

passing said N sampled data signals in response to said first selection signal;

comparing said selected one of said N clock signals and each of said N sampled data signals in phase to produce post-comparison data signals;

determining an average falling edge phase from said N sampled data signals to generate said first average falling edge phase data and a second average falling edge phase data;

determining an average rising edge phase from said N sampled data signals and said second average falling edge phase data;

detecting a duty of each of said N sampled data signals to produce duty data;

determining a data selection phase based on an average rising edge phase data and said duty data for said N sampled data signals;

selecting one from said post-comparison data signals which has a phase near to said data selection phase, to output said selected post-comparison data signal as a selection data signal; and carrying out a re-timing operation to said selection data signal based on said selected one of said N clock signals to output to said output switching circuit.

13. A method according to claim 8, wherein said (c) producing includes:

selecting said selected one of said N clock signals based on a first average falling edge phase data;

passing said N sampled data signals in response to said first selection signal;

comparing said selected one of said N clock signals and each of said N sampled data signals in phase to produce post-comparison data signals;

determining an average rising edge phase from said N sampled data signals to generate a first average rising edge phase data and a second average rising edge phase data;

determining an average falling edge phase from said N sampled data signals and said second average rising edge phase data;

detecting a duty of each of said N sampled data signals to produce duty data;

determining a data selection phase based on an average falling edge phase data and said duty data for said N sampled data signals;

selecting one from said post-comparison data signals which has a phase near to said data selection phase, to output said selected post-comparison data signal as a selection data signal; and carrying out a re-timing operation to said selection data signal based on said selected one of said N clock signals.

14. A method according to claim 8, wherein said (c) producing includes:

selecting said selected one of said N clock signals based on a first average falling edge phase data;

passing said N sampled data signals in response to said first selection signal;

comparing said selected one of said N clock signals and each of said N sampled data signals in phase to produce post-comparison data signals;

determining an average falling edge phase from said N sampled data signals to generate said first average falling edge phase data and a second average falling edge phase data;

determining an average rising edge phase from said N sampled data signals and said second average falling edge phase data;

determining a data selection phase based on an average rising edge phase data;

selecting one from said post-comparison data signals which has a phase near to said data selection phase, to output said selected post-comparison data signal as a selection data signal; and carrying out a re-timing operation to said selection data signal based on said selected one of said N clock signals.

15. A digital PLL (phase locked loop) circuit comprising:

a plurality of internal circuits, each of which is selected in response to a first selection signal, and outputting a set of a selected one of N clock signals and an identified data signal from N sampled data signals, which corresponds to said selected one of said N clock signals, in response to said selected one of said N clock signals, when said internal circuit is selected; and an output switching circuit selecting said set corresponding to said selected internal circuit from among said set from said plurality of internal circuits based on a second selection signal.

16. The digital PLL (phase locked loop) circuit according to claim 15, further comprising a sampling circuit sampling a burst data signal in response to a multi-phase clock signal to produce said N (N is a positive integer larger than one) sampled data signals, said multi-phase clock signal including said N clock signals, each of which has substantially the same frequency as said data signal.

17. A method of reducing a time interval between burst data signals in a digital PLL (phase locked loop) circuit, comprising:

(a) selecting one of a plurality of internal circuits other than a currently used internal circuit in response to a first selection signal;

(b) producing a set of a selected one of N clock signals and an identified data signal from N sampled data signals in response to said selected one of said N clock signals in said selected internal circuit; and (c) selecting one of said set from said plurality of internal circuits based on a second selection signal.

18. The method of claim 17, further comprising sampling a burst data signal in response to a multi-phase clock signal to produce said N (N is a positive integer larger than one) sampled data signals, said multi-phase clock signal including said N clock signals, each of which has substantially the same frequency as said data signal.

* * * * *